US009378972B2

(12) United States Patent
Cheng et al.

(10) Patent No.: US 9,378,972 B2
(45) Date of Patent: *Jun. 28, 2016

(54) INTEGRATION OF DENSE AND VARIABLE PITCH FIN STRUCTURES

(71) Applicant: GLOBALFOUNDRIES INC., Grand Cayman (KY)

(72) Inventors: Kangguo Cheng, Schenectady, NY (US); Matthew E. Colburn, Schenectady, NY (US); Bruce B. Doris, Brewster, NY (US); Ali Khakifirooz, Mountain View, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/632,313

(22) Filed: Feb. 26, 2015

(65) Prior Publication Data

US 2015/0170927 A1    Jun. 18, 2015

Related U.S. Application Data

(63) Continuation of application No. 13/961,336, filed on Aug. 7, 2013, now Pat. No. 9,040,371.

(51) Int. Cl.
| | | |
|---|---|---|
| *H01L 21/311* | (2006.01) | |
| *H01L 21/308* | (2006.01) | |
| *H01L 27/088* | (2006.01) | |
| *H01L 21/84* | (2006.01) | |
| *H01L 27/108* | (2006.01) | |
| *H01L 29/06* | (2006.01) | |
| *H01L 27/11* | (2006.01) | |

(52) U.S. Cl.
CPC ........ *H01L 21/3086* (2013.01); *H01L 21/3088* (2013.01); *H01L 21/845* (2013.01); *H01L 27/0886* (2013.01); *H01L 27/10826* (2013.01); *H01L 27/1104* (2013.01); *H01L 29/0657* (2013.01)

(58) Field of Classification Search
CPC ............ H01L 21/3086; H01L 21/3088; H01L 21/845; H01L 27/0886; H01L 27/10826; H01L 27/1104; H01L 29/0657; H01L 27/10823; H01L 21/28; H01L 21/823821; H01L 21/823431; H01L 27/11; H01L 27/0207
See application file for complete search history.

(56) References Cited

U.S. PATENT DOCUMENTS

| | | | |
|---|---|---|---|
| 6,875,703 | B1 | 4/2005 | Furukawa et al. |
| 7,301,210 | B2 | 11/2007 | Abadeer et al. |
| 7,763,531 | B2 | 7/2010 | Abadeer et al. |
| 8,030,218 | B2 | 10/2011 | Zhu |
| 8,105,901 | B2 | 1/2012 | Cheng et al. |

(Continued)

OTHER PUBLICATIONS

Chen, Y., et al. "Mandrel and Spacer Engineering Based Self-Alighned Triple Patterning" Proceedings of the SPIE, vol. 8328. Mar. 2012. (10 Pages)

(Continued)

*Primary Examiner* — Michelle Mandala
(74) *Attorney, Agent, or Firm* — Catherine Ivers; Hoffman Warnick LLC

(57) ABSTRACT

Methods for forming semiconductor devices. Methods for forming fin structures include forming first sidewalls around a first set of mandrels. The first set of mandrels is removed and second sidewalls are formed around the first sidewalls and a second set of mandrels. The first sidewalls and the second set of mandrels are removed and an underlying layer around the second sidewalls is etched.

11 Claims, 6 Drawing Sheets

(56) References Cited

U.S. PATENT DOCUMENTS

| | | |
|---|---|---|
| 8,242,022 B2 | 8/2012 | Kim |
| 2007/0065990 A1 | 3/2007 | Degroote et al. |
| 2011/0127582 A1 | 6/2011 | Cheng et al. |
| 2012/0132616 A1 | 5/2012 | Barnola et al. |
| 2012/0280283 A1 | 11/2012 | Cheng et al. |
| 2014/0159164 A1* | 6/2014 | Woo et al. ........... H01L 21/3086 257/401 |
| 2014/0353752 A1* | 12/2014 | Cheng et al. .......... H01L 29/785 257/347 |

OTHER PUBLICATIONS

Choi, Y., et al. "A Spacer Patterning Technology for Nanoscale CMOS" IEEE Transactions on Electron Devices, vol. 49, No. 3. Mar. 2002. pp. 436-441.

* cited by examiner

INTEGRATION OF DENSE AND VARIABLE PITCH FIN STRUCTURES

CROSS REFERENCE TO RELATED APPLICATIONS

This application is a Continuation of co-pending application Ser. No. 13/961,336, filed on Aug. 7, 2013, incorporated herein by reference.

BACKGROUND

1. Technical Field

The present invention relates to nanoscale fabrication and, more particularly, to fabrication of structures using sidewall image transfer.

2. Description of the Related Art

In conventional sidewall image transfer (SIT), sidewalls are formed around a structure. The structure is then removed, leaving only the sidewalls. The sidewalls are used to block an etch, resulting in relatively small feature sizes. Toward this end, SIT can be performed multiple times, shrinking the feature size with each iteration.

However, while performing multiple SIT iterations is effective at producing structures with regular spacing, it is challenging to integrate such processes with regions that have variable spacing. In one example, a dense fin pitch of less than about 40 nm may be desired, where this is less than one half the lithographic limit. To form such dense fin structures, the SIT process may be applied twice. At the same time, for example in a static random access memory (SRAM) area, variable fin spacing, with fin pitch less than the lithography limit but larger than ½ of the lithography limit, may be desired to achieve high SRAM cell density. Because of the lithographic limits in this example, single fin trimming at 40 nm would not be doable, and there would be no way to integrate the SIT regions with variable fin spacing regions.

SUMMARY

Methods for forming fin structures include forming first sidewalls around a first set of mandrels. The first set of mandrels is removed and second sidewalls are formed around the first sidewalls and a second set of mandrels. The first sidewalls and the second set of mandrels are removed and an underlying layer around the second sidewalls is etched.

These and other features and advantages will become apparent from the following detailed description of illustrative embodiments thereof; which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
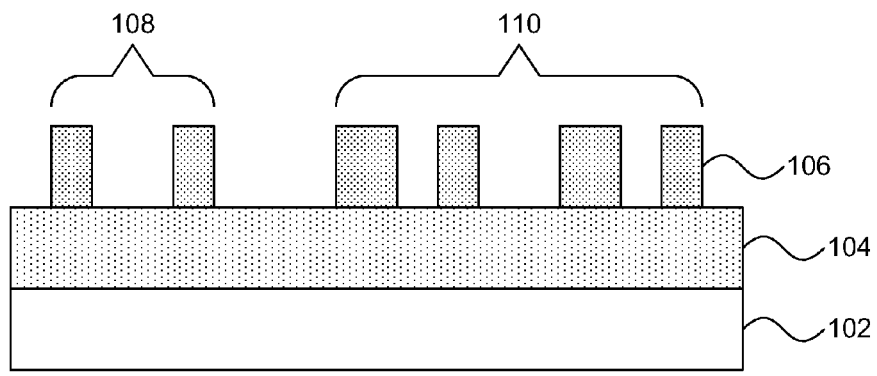
FIG. 1 is a cross-sectional view of a step in forming fin structures having respective regions of uniform and variable fin pitch in accordance with the present principles.

The present principles provide the integration of densely packed, uniform pitch fins with non-uniform fin pitch fins using shared sidewall image transfer (SIT) processes. To accomplish this, a protective layer is deposited over the non-uniform regions while SIT is performed on the uniform regions. The protective layer is then removed for a second SIT process performed on both regions, allowing for the simultaneous creation of the dense, uniform pitch fins and the variable pitch fins. While the details of the present embodiments are described in accordance with the formation of fins, those having ordinary skill in the art will understand that the principles of the present invention are applicable to formation of other structures such as metal interconnects, transistor gates or contact structures, etc., if integration of dense and regularly spaced features and features at variable spacing is desired.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a step in forming dense, uniform pitch fins with variable pitch fins is shown. A substrate 102 may be formed from a bulk substrate material, such as silicon or another appropriate semiconductor, or may instead be formed as a semiconductor-on-insulator substrate. An optional hardmask layer 104 may be formed on the substrate 102 from an appropriate hardmask material including, e.g., amorphous carbon. Additional layers may be formed below mandrels 106 as well, corresponding to materials to be patterned. Mandrels 106 are formed on top of the hardmask layer 104. The mandrels 106 may be formed by depositing a layer of mandrel material, such as amorphous or polycrystalline silicon, and etching the material using conventional lithography and reactive ion etching (RIE). The mandrels are formed in two separate groups: a first group 108 having uniform width and spacing and a second group 110 having variable width and spacing.

The uniform group 108 is formed according to a minimum pitch available to the lithographic fabrication process being used. In one exemplary embodiment, the minimum pitch is 80 nm. Thus the mandrels 106 in the uniform group are formed having an exemplary width of, e.g., about 30 nm with a spacing of e.g., about 50 nm. This spacing allows the SIT processes to form structures that will ultimately have uniform spacing. The feature size and separation for the variable group 110 may be any appropriate size but is bounded by the same lithographic feature size limitations present for the uniform group 108.

Figure 2:
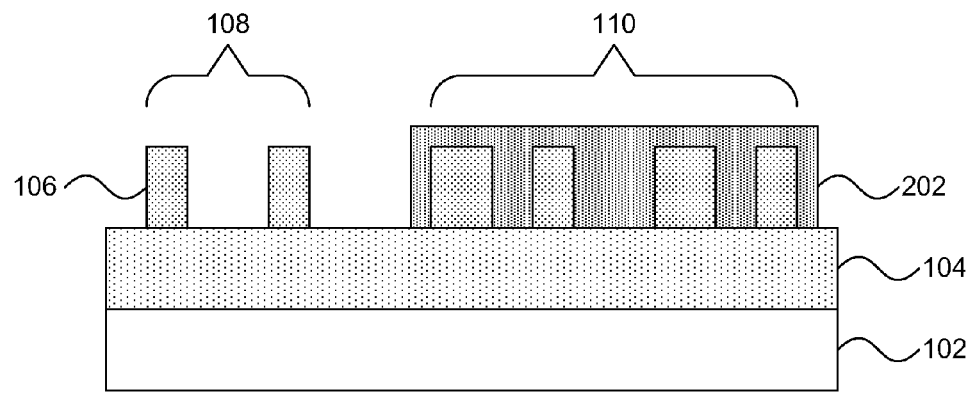
FIG. 2 is a cross-sectional view of a step in forming fin structures having respective regions of uniform and variable fin pitch in accordance with the present principles.

Referring now to FIG. 2, a step in forming dense, uniform pitch fins with variable pitch fins is shown. A protective layer 110 is deposited over the variable group 110. The protective layer may be formed from any suitable material, such that it is selective with respect to the etch of the mandrels 106 and hardmask 104. For example, in the case where mandrel 106 is made of amorphous or polycrystalline silicon and the hardmask 104 is made of amorphous carbon, a suitable protective layer may be silicon nitride. This layer can be deposited by any suitable process, including for example chemical vapor deposition (CVD), and may be patterned using lithography and RIE process.

Figure 3:
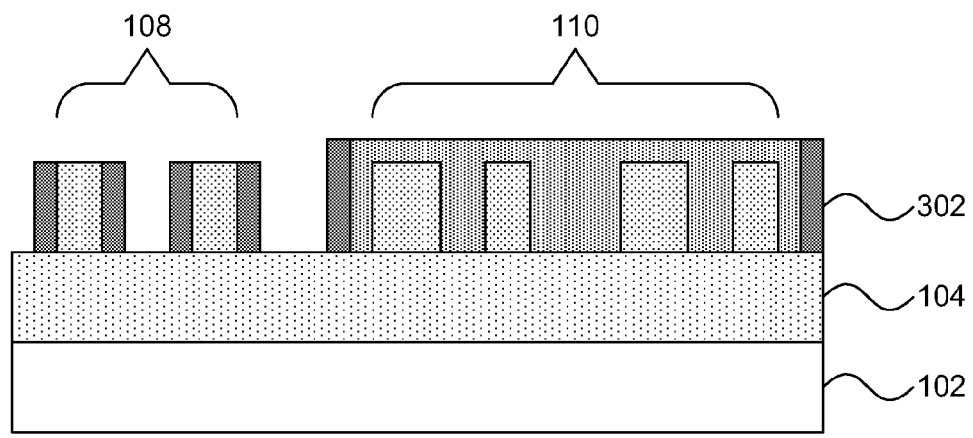
FIG. 3 is a cross-sectional view of a step in forming fin structures having respective regions of uniform and variable fin pitch in accordance with the present principles.

Referring now to FIG. 3, a step in forming dense, uniform pitch fins with variable pitch fins is shown. Sidewall spacers 302 are formed by depositing a spacer material, e.g., silicon nitride, as a uniform layer using, e.g., chemical vapor deposition or atomic layer deposition. A timed, anisotropic etch such as a RIE is then used to remove the spacer material from the horizontal surfaces, leaving only the sidewall spacers 302. At this step, sidewall spacers may form on the vertical sidewalls of the protective layer 202 as well.

Figure 4:
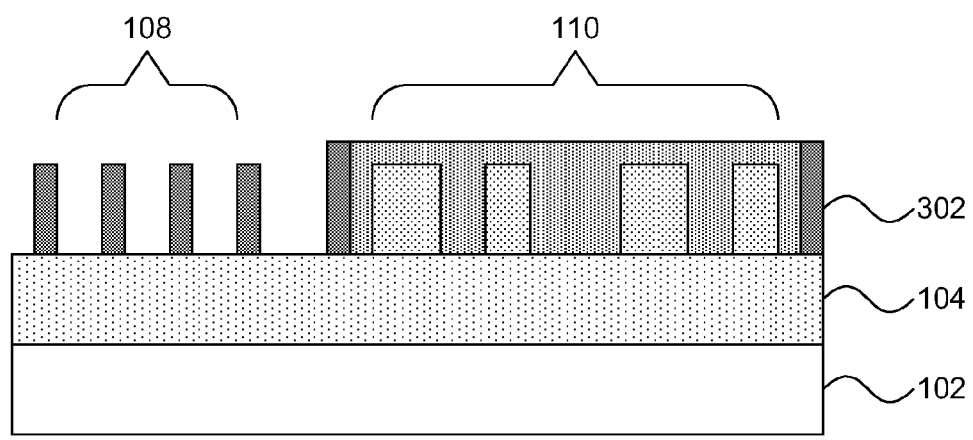
FIG. 4 is a cross-sectional view of a step in forming fin structures having respective regions of uniform and variable fin pitch in accordance with the present principles.

Referring now to FIG. 4, a step in forming dense, uniform pitch fins with variable pitch fins is shown. The mandrels 106 in the uniform group 108 are removed, leaving gaps between the sidewall spacers 302 in that region. The mandrels 106 may be removed using, e.g., a wet chemical etch. Mandrels in the variable fin pitch group 110 are protected by the protective layer 202.

Figure 5:
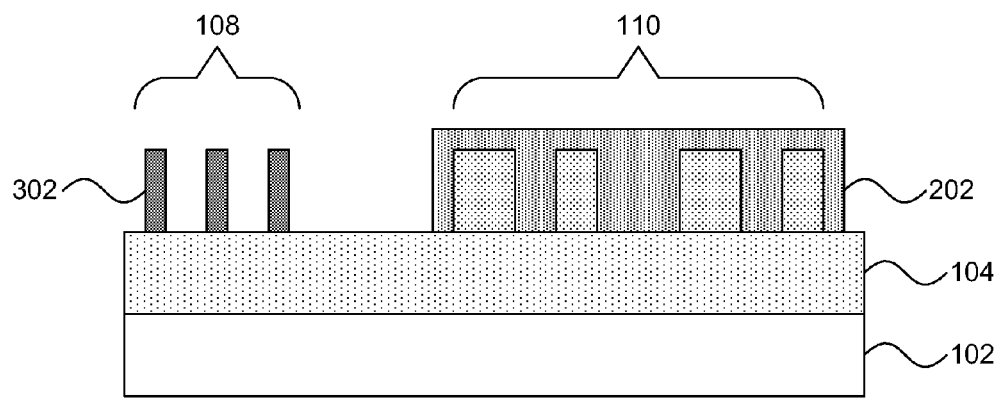
FIG. 5 is a cross-sectional view of a step in forming fin structures having respective regions of uniform and variable fin pitch in accordance with the present principles.

Referring now to FIG. 5, a step in forming dense, uniform pitch fins with variable pitch fins is shown. Some of the sidewall spacers 302 in the uniform region 108 may be removed in accordance with the design requirements. Each spacer 302 in the uniform region 108 defines the locations of two fins in the final structure, so determining the number of spacers 302 determines the number of fins. The spacers 302 around the protective layer 202 are also removed.

Figure 6:
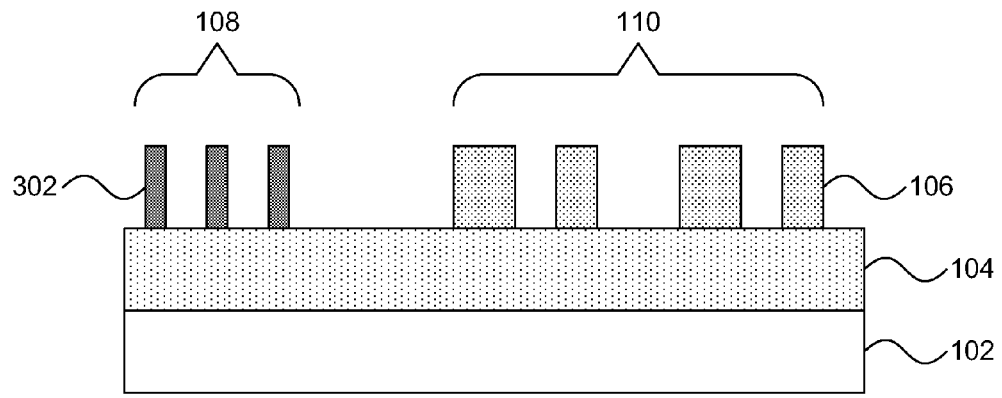
FIG. 6 is a cross-sectional view of a step in forming fin structures having respective regions of uniform and variable fin pitch in accordance with the present principles.

Referring now to FIG. 6, a step in forming dense, uniform pitch fins with variable pitch fins is shown. The protective layer 202 is removed by, e.g., a wet chemical etch, leaving the mandrels 106 in the variable region 110 exposed. For example, in the case where the protective layer 202 is made out of silicon oxide, the protective layer 202 can be removed with a wet etch that contains hydrogen fluoride, such as buffered HF solution.

Figure 7:
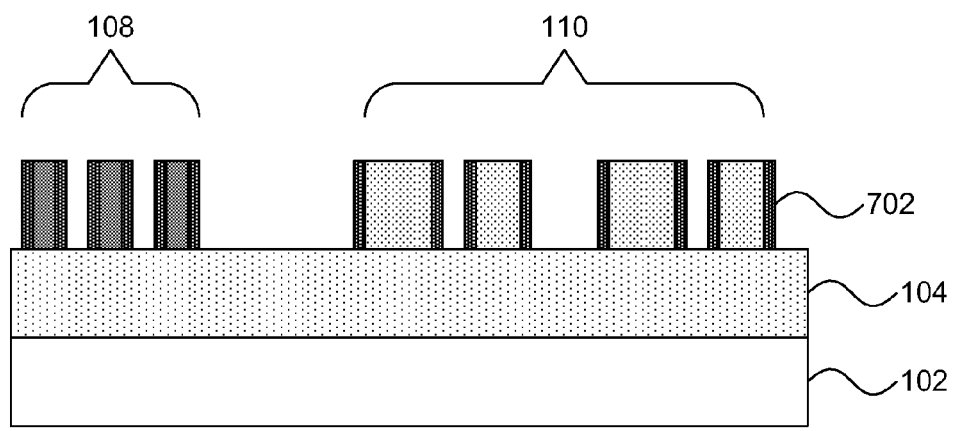
FIG. 7 is a cross-sectional view of a step in forming fin structures having respective regions of uniform and variable fin pitch in accordance with the present principles.

Referring now to FIG. 7, a step in forming dense, uniform pitch fins with variable pitch fins is shown. Second sidewall spacers 702 are formed by depositing a second spacer material as a uniform layer using, e.g., chemical vapor deposition or atomic layer deposition. The second spacer material should be selective with respect to etches of the first spacer material 302, mandrel material 106, and the hardmask 104. For example, with the first spacer material 302 being made of silicon nitride and the mandrel material 106 being polycrystalline silicon, the second spacer material can be silicon dioxide. A timed, anisotropic etch such as a reactive ion etch is then used to remove the second spacer material from the horizontal surfaces, leaving only the second sidewall spacers 702.

Figure 8:
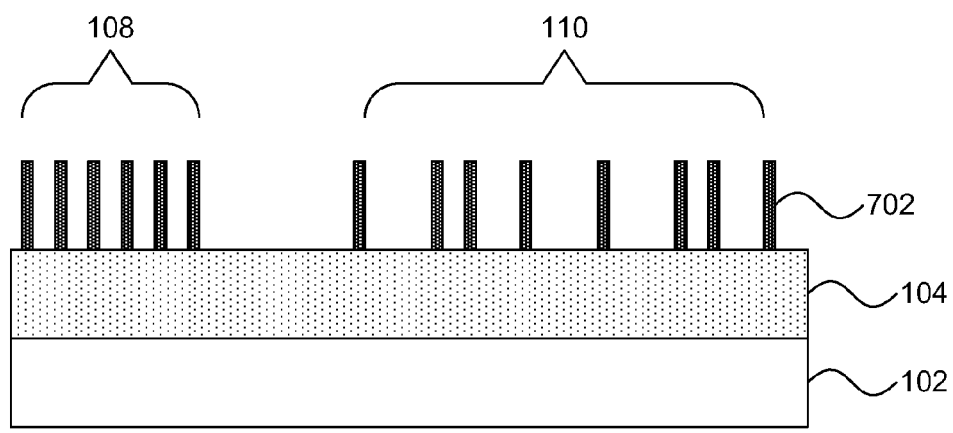
FIG. 8 is a cross-sectional view of a step in forming fin structures having respective regions of uniform and variable fin pitch in accordance with the present principles.

Referring now to FIG. 8, a step in forming dense, uniform pitch fins with variable pitch fins is shown. The original sidewall spacers 302 in the uniform region 108 are removed along with the mandrels 106 in the variable region 110. What remains are sidewalls 702, which are uniformly spaced in the uniform region 108 and variably spaced in the variable region 110.

Figure 9:
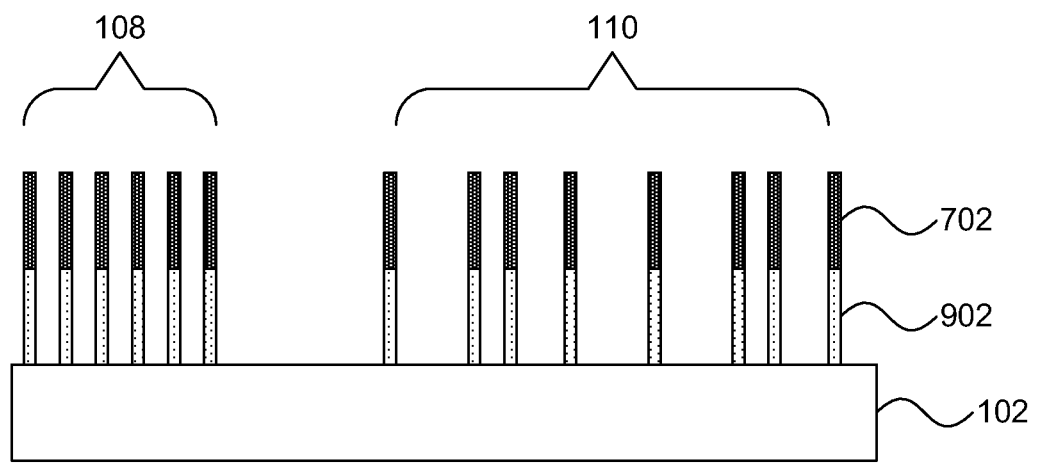
FIG. 9 is a cross-sectional view of a step in forming fin structures having respective regions of uniform and variable fin pitch in accordance with the present principles.

Referring now to FIG. 9, a step in forming dense, uniform pitch fins with variable pitch fins is shown. The image formed by the sidewalls 702 is transferred to underlying layers 104 to form patterned fins 902 in one or more etches. As can be seen, the fins in uniform group 108 are formed with a consisted pitch, whereas the fins formed in variable group 110 may have any spacing. From this point, the fins 902 may be used in any further fabrication processes. A multi-step etch process may be used to first transfer the pattern formed in the sidewalls 702 into the hardmask layer 104 and then into the substrate 102. For example, with an amorphous carbon hardmask 104, an RIB process with oxygen-based plasma may be used to pattern the hardmask 104 into set of structures 902 and then the features may be etched into the substrate 102 using an RIE process that etches the substrate 102. The sidewalls 702 and hardmask patterns 902 are then removed for example with a HF-based wet etch and oxygen-based plasma, respectively.

Figure 10:
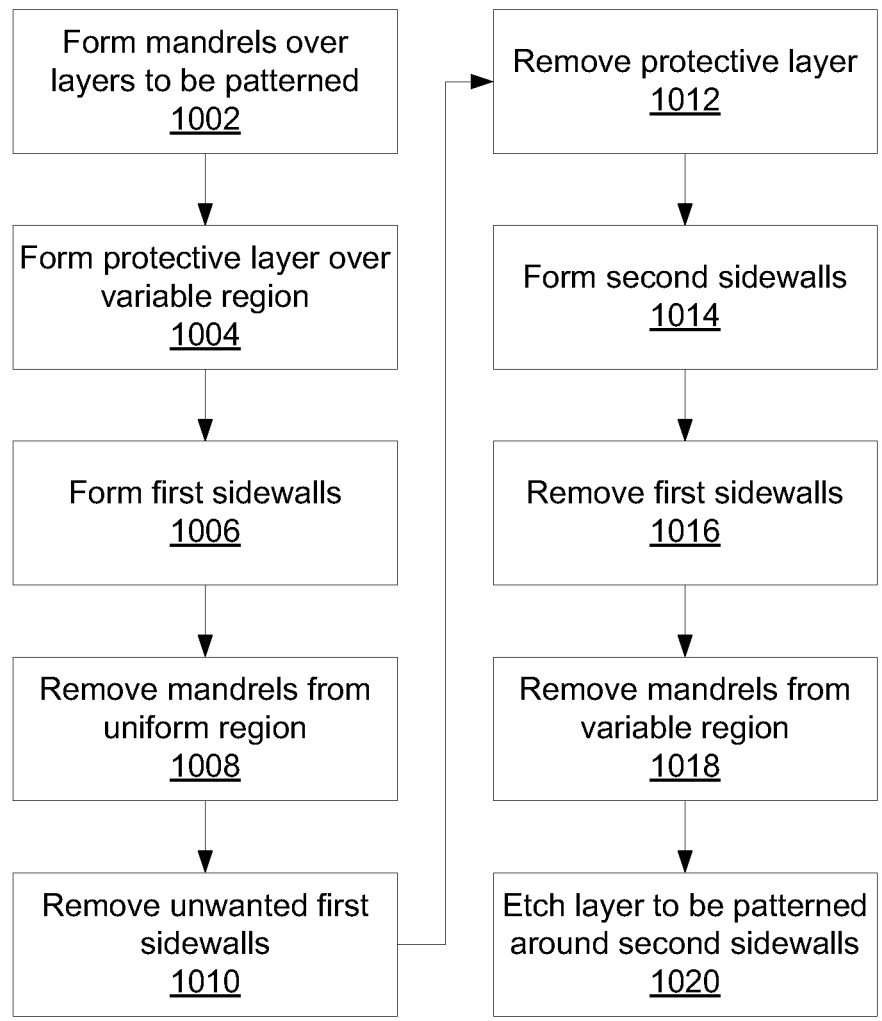
FIG. 10 is a block/flow diagram of a method for forming fin structures having respective regions of uniform and variable fin pitch in accordance with the present principles.

Referring now to FIG. 10, a block/flow diagram of a method of forming dense, uniform pitch fins with variable pitch fins is shown. Block 1002 forms mandrels 106 over layers to be patterned. In the present examples this includes a hardmask layer 104, but may also include one or more additional layers. The mandrels 106 are formed in two or more groups, a first group 108 spaced at such a pitch as to produce uniform fin pitches and a second group 110 spaced with variable pitch.

Block 1004 forms a protective layer 202 over the variable group 110. This protective layer 202 allows a first SIT process to be performed on the uniform group 108 without affecting the variable group 110. Block 1006 forms first sidewalls 302 around the uniform group 108 and, incidentally, around the protective layer 202, by uniformly depositing spacer material and performing a timed, anisotropic etch such as a reactive ion etch.

Block 1008 removes the exposed mandrels 106 in the uniform region 108 using, e.g., a wet etch. Block 1010 then removes any unwanted sidewalls 302, including those around the protective layer 202 and any in the uniform region 108 which would result in undesired fins. Block 1010 removes the protective layer 202, exposing the mandrels 106 in the variable region 110.

Block 1014 forms a second set of sidewalls 702. The second sidewalls 702 are around the original sidewalls 302 and the remaining mandrels 106. It should be noted that the second sidewalls 702 should be formed with a different sidewall material and should have a smaller thickness than that used for the first sidewalls 302. This allows for selective etching and a small feature size.

Block 1016 removes the first sidewalls 302 in the uniform region 108 and block 1018 removes the remaining mandrels 106 in the variable region 110. These features may be removed by, e.g., one or more wet etch processes, leaving only the second sidewalls 702 standing on layer 104. Block 1020 then etches layer 104 around the second sidewalls 702, leaving only free-standing fins 902 of the layer 104 material. The fins 902 in the uniform region 108 have uniform spacing, while the fins 902 in the variable region 110 have varied spacing.

Having described preferred embodiments of methods for integrating dense and variable pitch fin structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming fin structures, comprising:
   forming first sidewalls around a first set of mandrels;
   removing the first set of mandrels;
   forming second sidewalls around the first sidewalls and a second set of mandrels;
   removing the first sidewalls and the second set of mandrels; and
   etching an underlying layer around the second sidewalls.

2. The method of claim 1, wherein the first set of mandrels has a uniform fin width and spacing and wherein the second set of mandrels has a variable fin width and spacing.

3. The method of claim 2, wherein fins formed in a region having the first set of mandrels have a spacing that is less than half of a minimum pitch of a lithography process used to form the first set of mandrels and wherein fins formed in a region having the second set of mandrels have a spacing that is greater than half, but less than the minimum pitch of the lithography process.

4. The method of claim 1, further comprising forming a protective layer over the second set of mandrels before the formation of the first sidewalls and removing the protective layer after the formation of the first sidewalls.

5. The method of claim 1, further comprising removing one or more of the first sidewalls in the uniform pitch region before forming the second sidewalls.

6. The method of claim 1, wherein the underlying layer comprises a hardmask layer.

7. The method of claim 6, wherein the underlying layer further comprises one or more additional layers to be etched.

8. The method of claim 1, wherein the second sidewalls are formed from a different material than a material of the first sidewalls.

9. The method of claim 8, wherein the material of the second sidewalls has etch selectivity with the material of the first sidewalls and the mandrels.

10. The method of claim 1, wherein the second sidewalls are thinner than the first sidewalls.

11. The method of claim 1, wherein the second sidewalls in the uniform fin pitch region have a uniform separation between sidewalls and wherein the second sidewalls in the variable fin pitch region have a variable separation between sidewalls.

* * * * *